(12) United States Patent
Su et al.

(10) Patent No.: US 9,485,871 B2
(45) Date of Patent: Nov. 1, 2016

(54) METHOD OF MAKING A LIGHT-EMITTING-DIODE LAMP TUBE

(71) Applicants: JUSTING TECHNOLOGY(TAIWAN) PTE LTD., Zhongli, Taoyuan County (TW); JUSTING TECHNOLOGY PTE. LTD., Singapore (SG)

(72) Inventors: Chia-Ching Su, Taoyuan (TW); Chih-Yuan Yen, Taoyuan (TW)

(73) Assignees: JUSTING TECHNOLOGY (TAIWAN) PTE LTD., Zhongli, Taoyuan County (TW); JUSTING TECHNOLOGY PTE. LTD., Singapore (SG)

( * ) Notice: Subject to any disclaimer, the term of this patent is extended or adjusted under 35 U.S.C. 154(b) by 450 days.

(21) Appl. No.: 14/041,256

(22) Filed: Sep. 30, 2013

(65) Prior Publication Data

US 2014/0096378 A1    Apr. 10, 2014

(30) Foreign Application Priority Data

Oct. 4, 2012 (TW) .............................. 101136701 A

(51) Int. Cl.
| | |
|---|---|
| *H05K 3/30* | (2006.01) |
| *H05K 3/28* | (2006.01) |
| *F21K 99/00* | (2016.01) |
| *F21Y 101/02* | (2006.01) |
| *F21Y 103/00* | (2016.01) |

(52) U.S. Cl.
CPC ................. *H05K 3/30* (2013.01); *F21K 9/175* (2013.01); *F21K 9/90* (2013.01); *F21Y 2101/02* (2013.01); *F21Y 2103/003* (2013.01); *Y10T 29/4913* (2015.01)

(58) Field of Classification Search
CPC .................................. H05K 3/30; F21V 15/01
USPC .............. 29/831, 829, 825, 592.1, 846, 832; 439/612, 80; 362/249.06, 249.14
See application file for complete search history.

(56) References Cited

U.S. PATENT DOCUMENTS

| | | | | |
|---|---|---|---|---|
| 8,628,342 | B2 * | 1/2014 | Tremblay ............... | H01R 33/09 362/646 |
| 8,827,486 | B2 * | 9/2014 | Lai ......................... | F21K 9/175 362/218 |
| 8,928,025 | B2 * | 1/2015 | Simon .................... | F21K 9/175 257/81 |
| 9,033,741 | B2 * | 5/2015 | Su .......................... | H01R 13/111 439/612 |
| 9,097,408 | B2 * | 8/2015 | Su .......................... | F21V 15/01 |
| 2004/0114017 | A1 * | 6/2004 | Yokoyama .............. | B41J 11/002 347/102 |
| 2012/0100639 | A1 * | 4/2012 | Urano ..................... | H01L 29/66333 438/4 |
| 2015/0219322 | A1 * | 8/2015 | Lin ......................... | F21K 9/175 362/217.17 |

\* cited by examiner

*Primary Examiner* — Peter DungBa Vo
*Assistant Examiner* — Kaying Kue
(74) *Attorney, Agent, or Firm* — Jackson IPG PLLC; Demian K. Jackson

(57) ABSTRACT

An automatic production method of making a light-emitting-diode lamp tube is disclosed. The method includes providing a circuit board in a shape of a long strip, printing a bonding layer, mounting electronic inserts, heating up the circuit board, assembling a heat dissipation seat, assembling a translucent cover and assembling an end cap, thereby accomplishing the lamp tube. By the abovementioned steps, the light-emitting-diode lamp tube can be produced automatically, the manufacturing process can be simplified to reduce the labor cost, and the yield factor can be improved considerably.

10 Claims, 10 Drawing Sheets

1

METHOD OF MAKING A LIGHT-EMITTING-DIODE LAMP TUBE

BACKGROUND OF THE INVENTION a) Field of the Invention

The present invention relates to a method of making a lamp tube, and more particularly to an automatic production method of making a light-emitting-diode lamp tube.

b) Description of the Prior Art

An early fluorescent lamp tube is mostly made of glass and contains small amount of mercury. Therefore, one should be very careful when taking or installing the fluorescent lamp tube; if the fluorescent lamp tube is broken accidentally, the mercury will flow out and damage the environment. In addition, if a person touches or adsorbs the mercury by accident, then he or she may be poisoned. On the other hand, although a conventional fluorescent lamp is cheaper, its wastes can result in mercury pollution or the fluorescent lamp can be fragile.

For a new generation of the fluorescent lamp, an LED (Light Emitting Diode) is used to give out light, but the structure is still the same as the early design of the fluorescent lamp, so as to be used in an early lamp bracket.

In addition, it is a direction of research and development for existing vendors to develop an automatic production method of making a light-emitting-diode lamp tube.

SUMMARY OF THE INVENTION

Accordingly, the primary object of the present invention is to provide an automatic production method of making a light-emitting-diode lamp tube.

To achieve the abovementioned object, the production method of the present invention includes (A) providing a circuit board in a shape of a long strip, wherein the circuit board is provided with an outbound circuit and an inbound circuit; (B) printing a bonding layer on a surface of the outbound circuit and the inbound circuit of the circuit board; (C) mounting electronic inserts, with that a connecting seat is disposed on the outbound circuit of the circuit board where the bonding layer is provided, and light emitting diodes are disposed on the inbound circuit of the circuit board where the bonding layer is provided, wherein the connecting seat is disposed at an end side of the circuit board; (D) heating up the circuit board to melt down the bonding layer, enabling the connecting seat and the light emitting diodes to be fixed on the circuit board; (E) providing a heat dissipation seat which is in a shape of a long strip and is provided with a straight fixing surface; (F) conducting a first assembling step to assemble and fix the circuit board that has been loaded with the light emitting diodes in the previous step (D) on the straight fixing surface of the heat dissipation seat; (G) providing a translucent cover which is a long strip of an arc-shaped unit; (H) conducting a second assembling step to assemble and fix the translucent cover on the heat dissipation seat that has been completed in the previous step (F), and to shield the circuit board; (I) providing an end cap which is a round body and is provided with a conductive terminal; (J) conducting a third assembling step to assemble and fix the end caps at two end sides of the semi-finished product that has been completed in the previous step (H), and to connect the conductive terminal with the connecting seat, thereby accomplishing the lamp tube.

By the abovementioned steps, the light-emitting-diode lamp tube can be produced automatically, the manufacturing process can be simplified to reduce the labor cost, and the yield factor can be improved considerably.

By the abovementioned technical features, a step (K) is further executed between the step (D) and the step (E) to conduct a detection test. The detection test is carried out by feeding in voltage and is able to separate non-defective products from defective products; subsequent steps are conducted for the non-defective products, whereas an examination and fixing step is performed for the defective products.

By the abovementioned technical features, in the said step (E) of providing the heat dissipation seat, the straight fixing surface can be provided with heat conductive grease to attach and fix the circuit board.

By the abovementioned technical features, a step (L) is further executed between the step (F) and the step (G) to conduct an aging test. The aging test can separate non-defective products from defective products; subsequent steps are conducted for the non-defective products, whereas an examination and fixing step is performed for the defective products.

By the abovementioned technical features, a step (M) is further executed following the step (J) to conduct a photoelectric detection test. The photoelectric test is able to separate non-defective products from defective products; an examination and fixing step is performed for the defective products.

By the abovementioned technical features, the step (L) is further executed following the step (M) to conduct the aging test. The aging test separates non-defective products from defective products; an examination and fixing step is performed for the defective products.

The abovementioned bonding layer can be a tin paste and in the step (D) of heating up the circuit board, the circuit board is heated up with a tin furnace.

By the abovementioned technical features, the round body of the said end cap is provided with an inner annular wall and the conductive terminal is formed integrally with the round body. The conductive terminal is formed with two electric connecting units and a pole-like conducting unit. The pole-like conducting unit is disposed in the inner annular wall, and each electric connecting unit and the pole-like conducting unit are connected together by a joining unit. In addition, each electric connecting unit is extended out of the round body from the joining unit.

By the abovementioned technical features, the said connecting seat is provided with a housing and the housing is provided at least with an insertion slot. An interior of the insertion slot is provided with a terminal and a conductive plate which is connected with the terminal. The conductive plate is also extended to a side of the housing to connect electrically with the outbound circuit of the circuit board. Furthermore, the insertion slot provides for insertion with the pole-like conducting unit of the end cap, such that the pole-like conducting unit can be inserted into the terminal to be energized.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
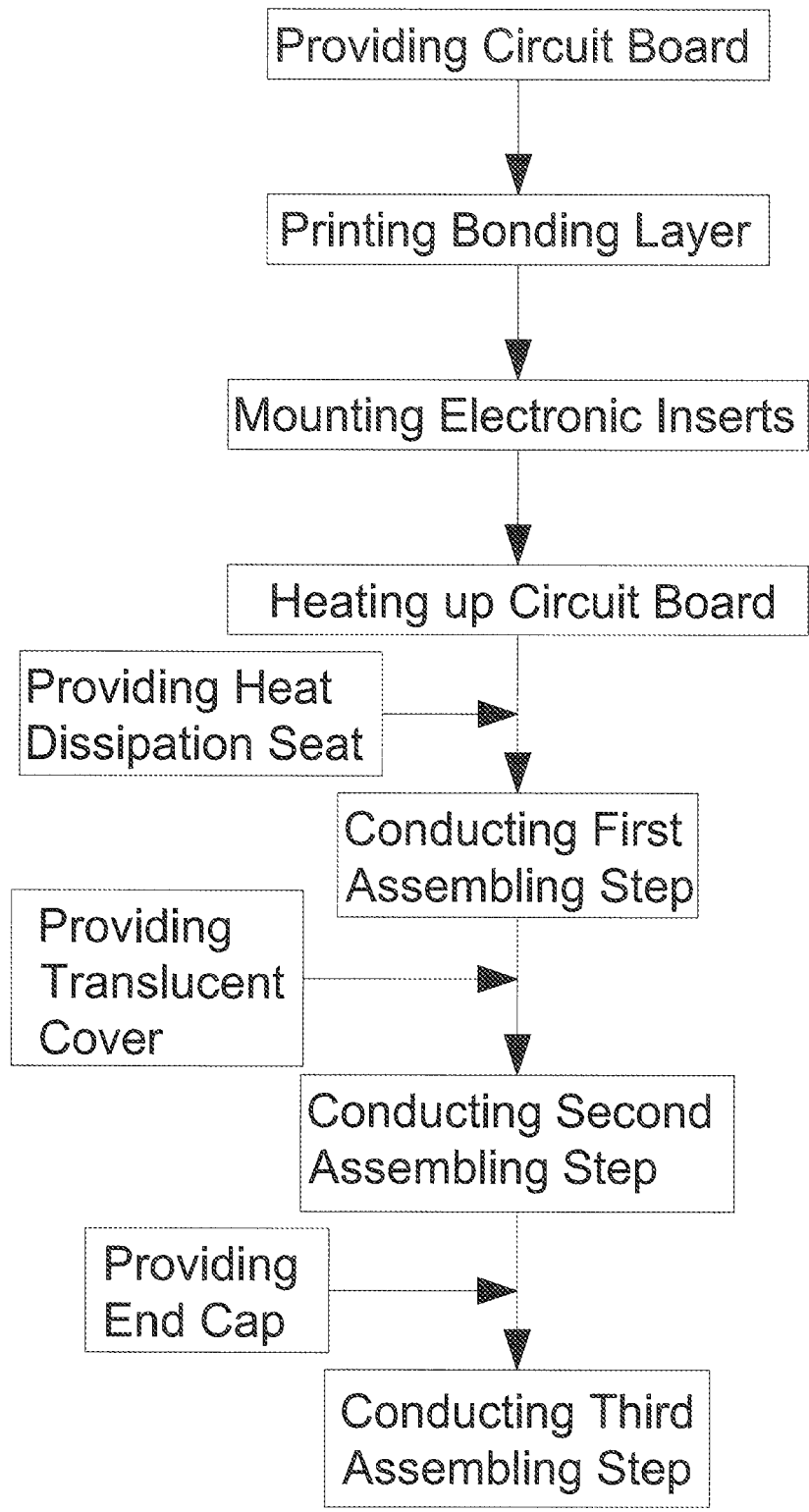
FIG. 1 shows a flow diagram of a method of making a light-emitting-diode lamp tub, according to the present invention.

FIG. 1 discloses a flow diagram of a method of making a light-emitting-diode lamp tube, according to the present invention. The method of the present invention comprises following steps orderly.

Figure 2:
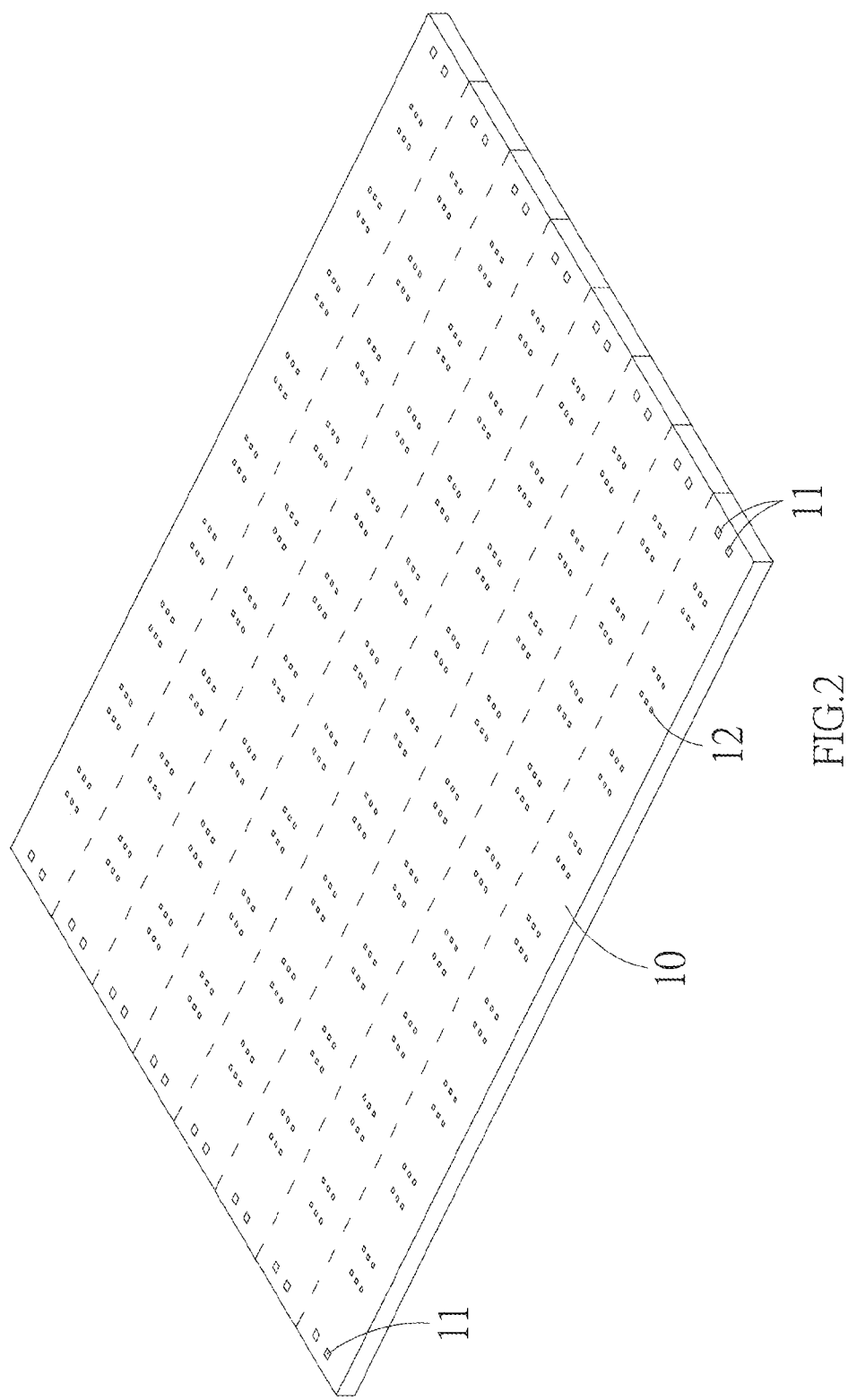
FIGS. 2 to 9 show schematic views of structures of the method of making a light-emitting-diode lamp tube, according to the present invention.

Step (A): providing a circuit board in a shape of a long strip. Referring to FIG. 2, the circuit board 10 is provided with an outbound circuit 11 and an inbound circuit 12, wherein the outbound circuit 11 is disposed in proximity to two end sides of the circuit board 10.

Step (B): printing. A bonding layer is printed on a surface of the outbound circuit and the inbound circuit of the circuit board, and the bonding layer can be a tin paste.

Figure 3:
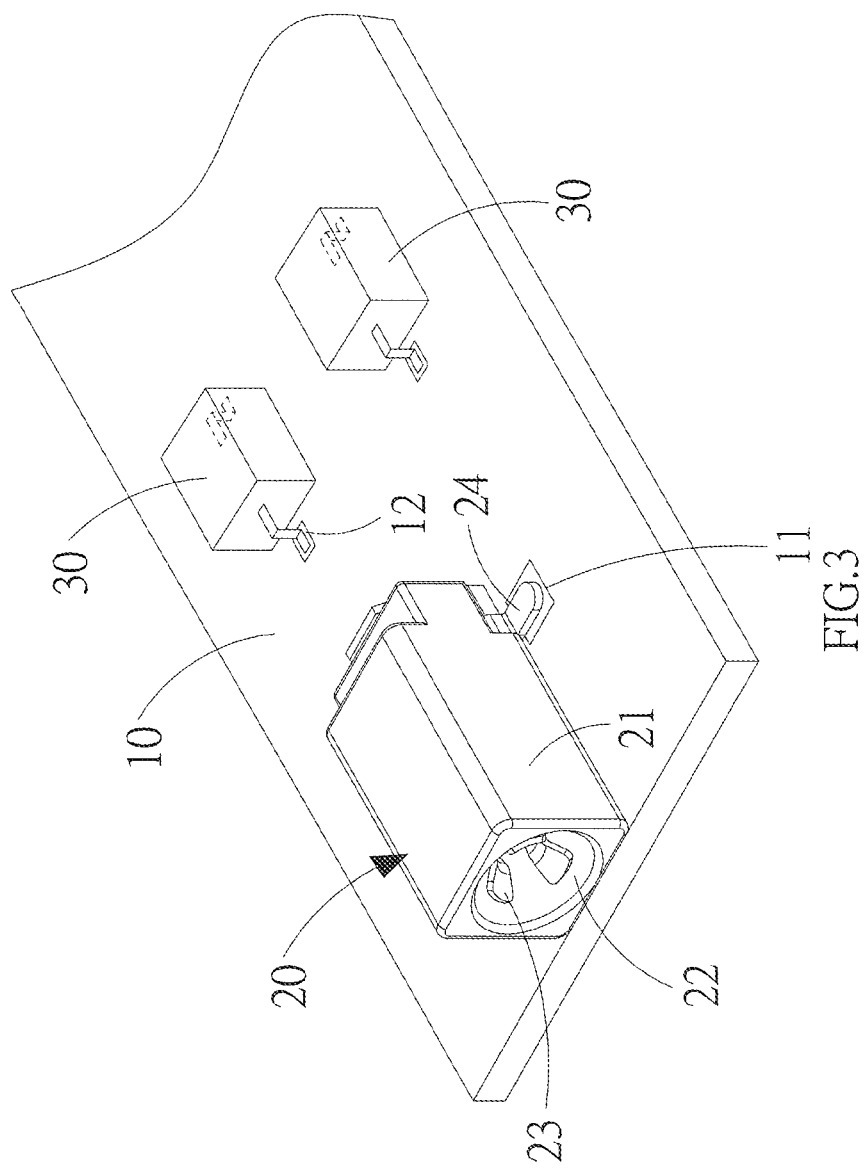
Figure 4:
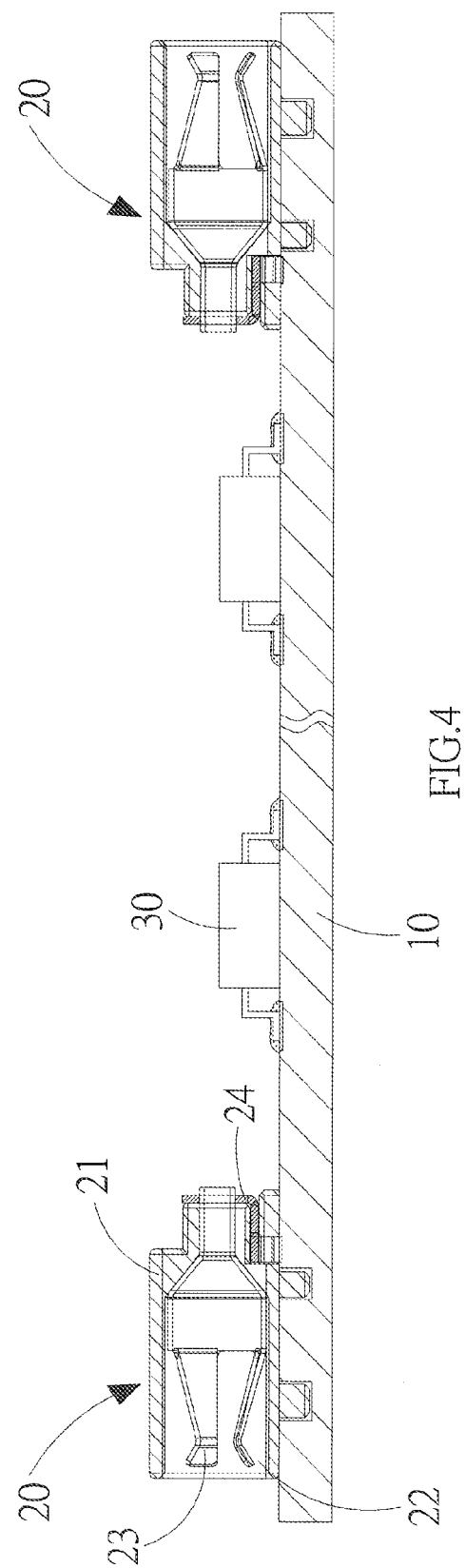

Step (C): mounting electronic inserts. Referring to FIG. 3, a connecting seat 20 is disposed on the outbound circuit 11 of the circuit board 10 where the bonding layer is provided, and light emitting diodes 30 are disposed on the inbound circuit 12 of the circuit board 10 where the bonding layer is provided, wherein the connecting seat 20 is located at an end side of the circuit board 10. The connecting seat 20 is provided with a housing 21, and the housing 21 is provided at least with an insertion slot 22. Referring to FIG. 4 at a same time, an interior of the insertion slot 22 is provided with a terminal 23 and a conductive plate 24 which is connected with the terminal 23. The conductive plate 24 is also extended to a side of the housing 21 to connect electrically with the outbound circuit of the circuit board 10.

Step (D): heating up the circuit board. The circuit board 10 is heated up with a tin furnace to melt down the bonding layer, enabling the connecting seat 20 and the light emitting diodes 30 to be fixed on the circuit board 10. In addition, the circuit board 10 in the steps (A) to (D) can be an entire piece of circuit board and is then divided into plural long strips of circuit board in a board separation step, after completing the step (D).

Figure 5:
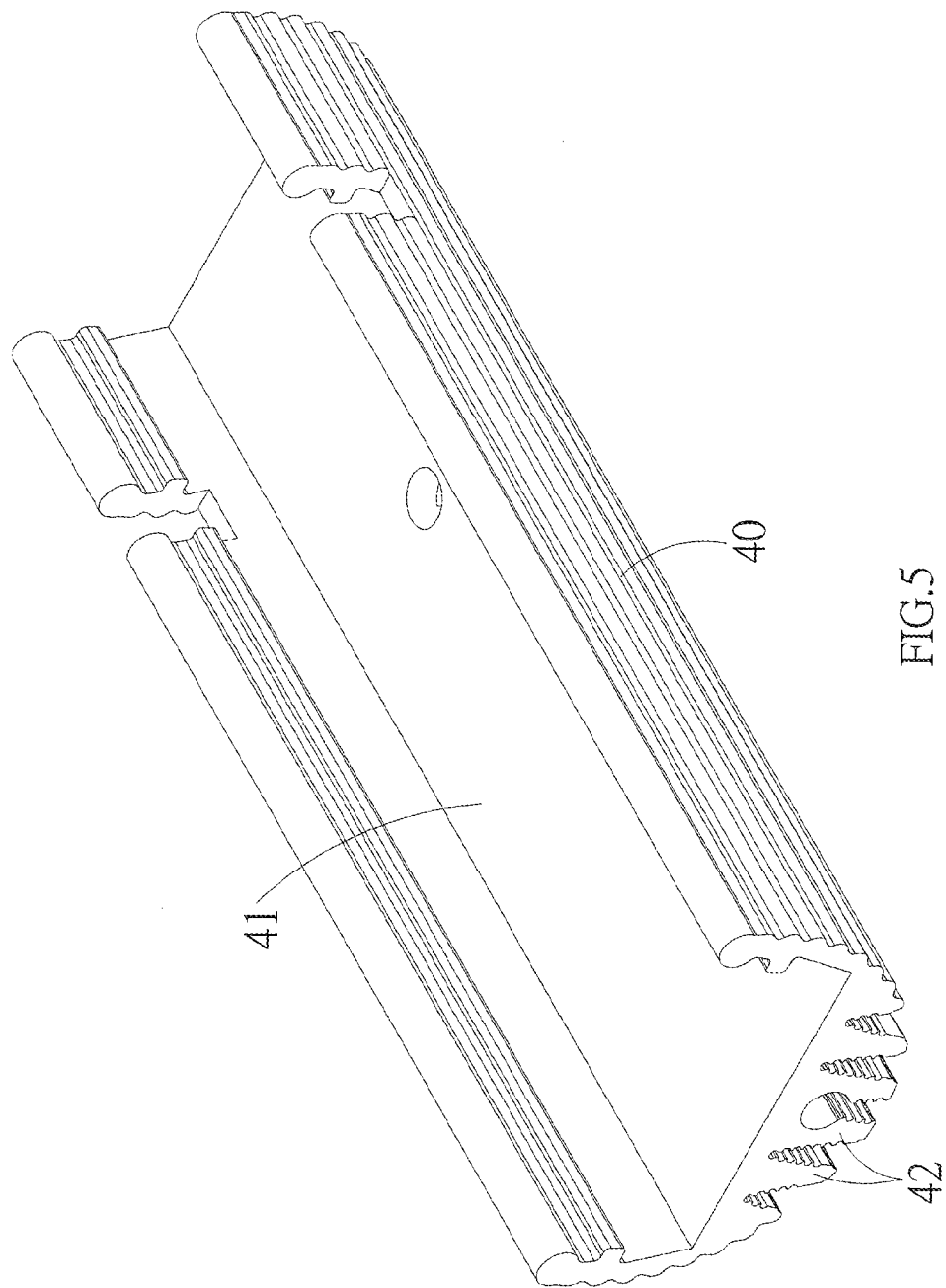

Step (E): providing a heat dissipation seat 40. Referring to FIG. 5, the heat dissipation seat 40 is in a shape of a long strip and is provided with a straight fixing surface 41; whereas, a lower side of the straight fixing surface 41 is provided with plural cooling ribs 42.

Figure 6:
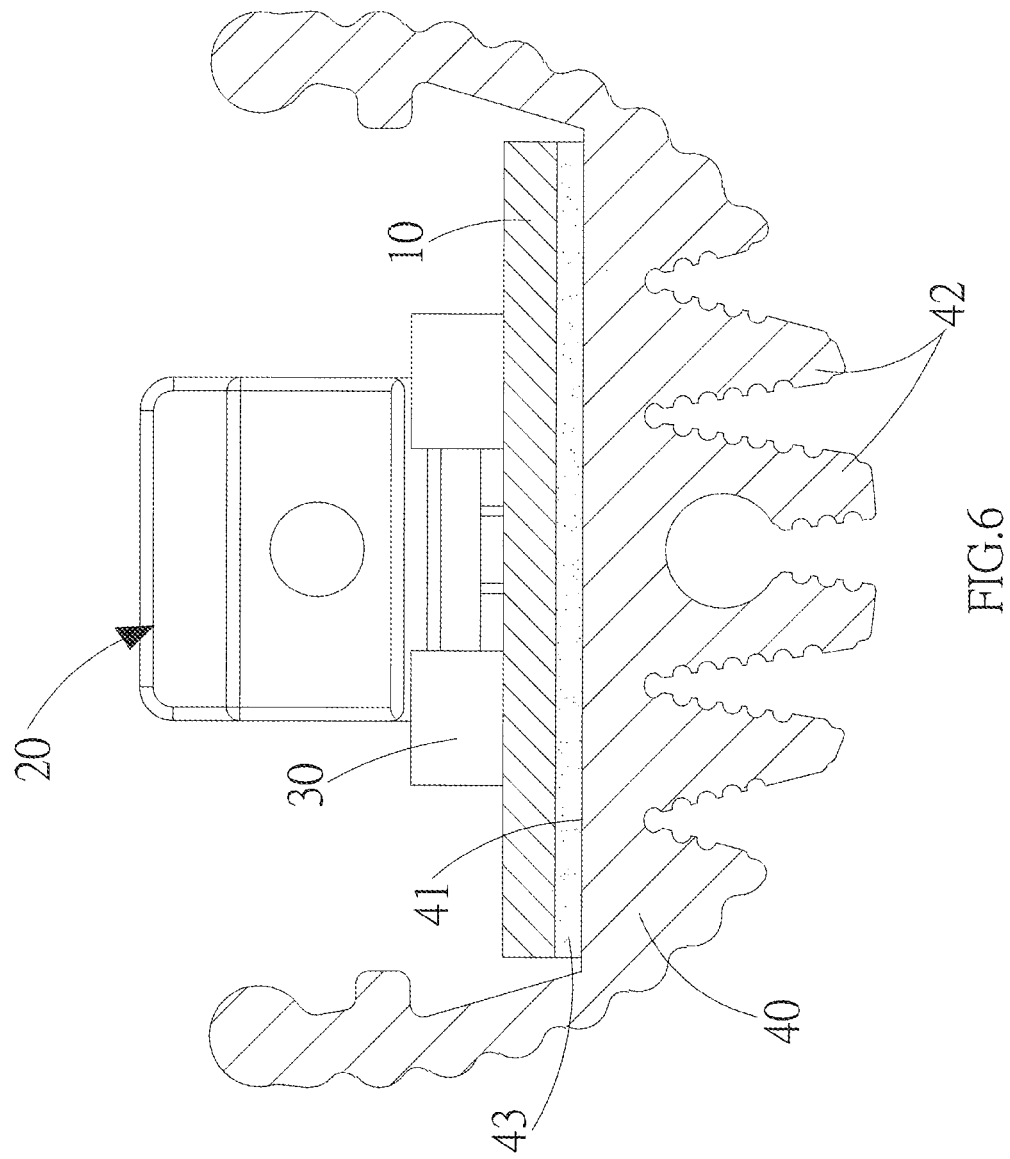

Step (F): conducting a first assembling step. Referring to FIG. 6, the circuit board 10 that has been loaded with the light emitting diodes 30 in the previous step (D) is assembled and fixed on the straight fixing surface 41 of the heat dissipation seat 40, wherein in the step (E) of providing the heat dissipation seat, the straight fixing surface 41 is provided with heat conductive grease 43 to attach and fix the circuit board 10.

Figure 7:
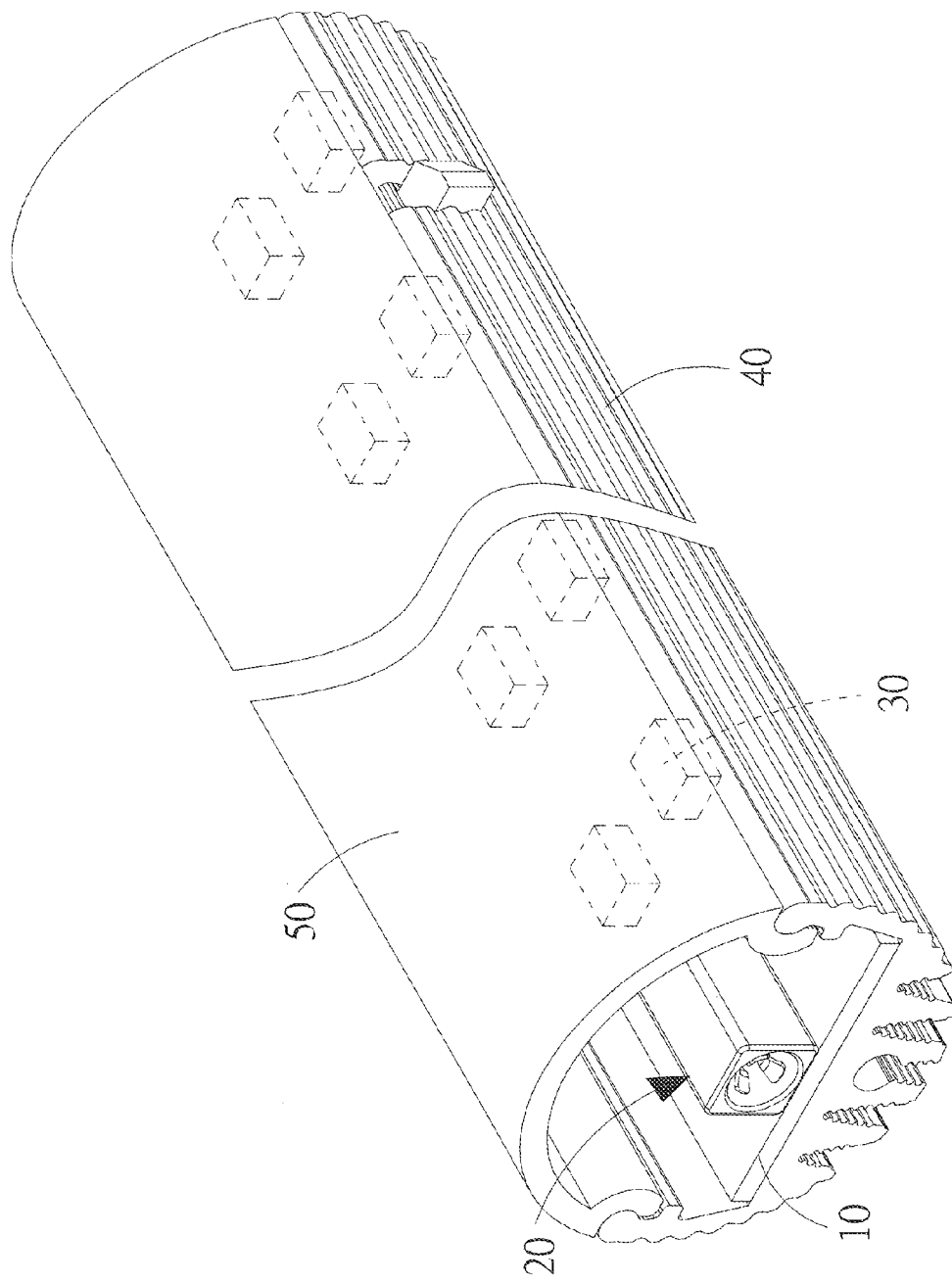

Step (G): providing a translucent cover 50. Referring to FIG. 7, the translucent cover 50 is a long strip of an arc-shaped unit.

Step (H): conducting a second assembling step. The translucent cover 50 is assembled and fixed on the heat dissipation seat 40 that has been completed in the previous step (F), and the circuit board 10 is shielded.

Figure 8:
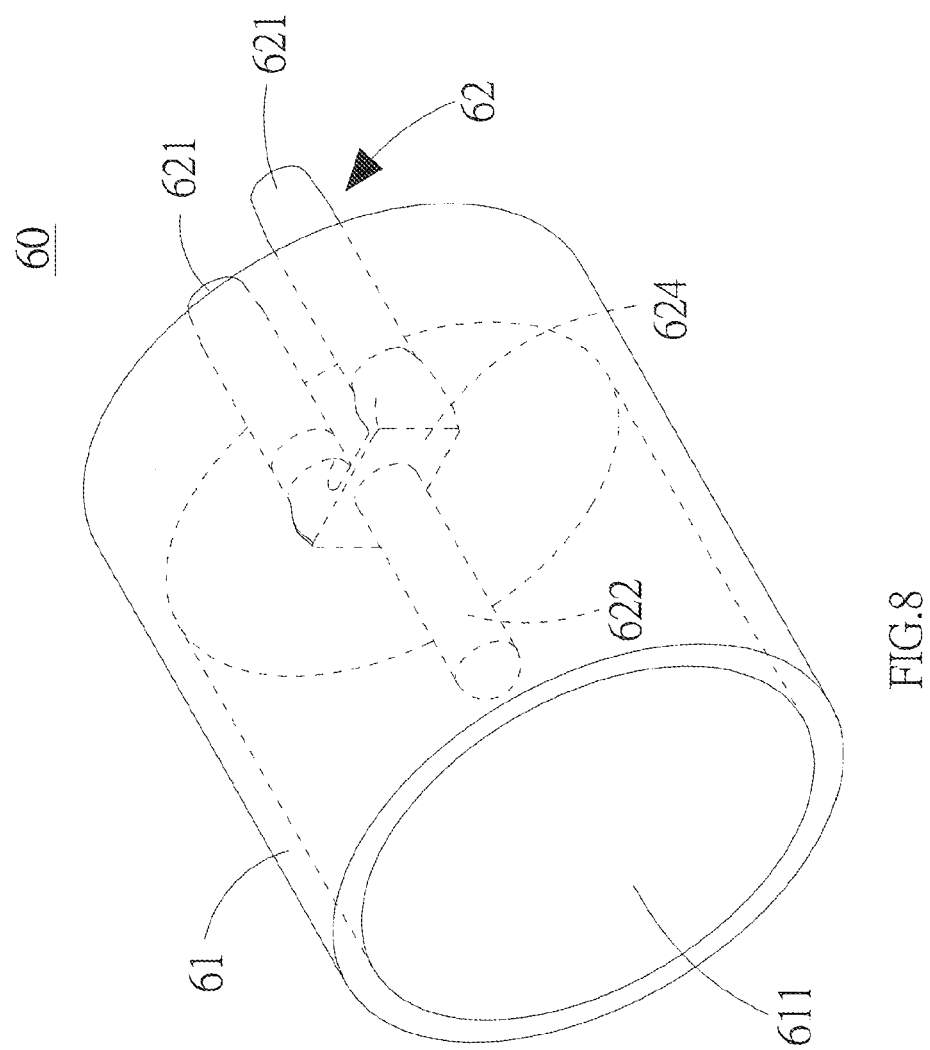

Step (I): providing an end cap 60. Referring to FIG. 8, the end cap 60 is a round body 61 and is provided with a conductive terminal 62. The round body 61 of the end cap 60 is provided with an inner annular wall 611, and the conductive terminal 62 is formed integrally with the round body 61 by injection molding. The conductive terminal 62 is formed with two electric connecting units 621 and a pole-like conducting unit 622, the pole-like conducting unit 622 is disposed in the inner annular wall 611, each electric connecting unit 621 and the pole-like conducting unit 622 are connected together by a joining unit 624, and each electric connecting unit 621 is extended out of the round body 61 from the joining unit 624.

Figure 9:
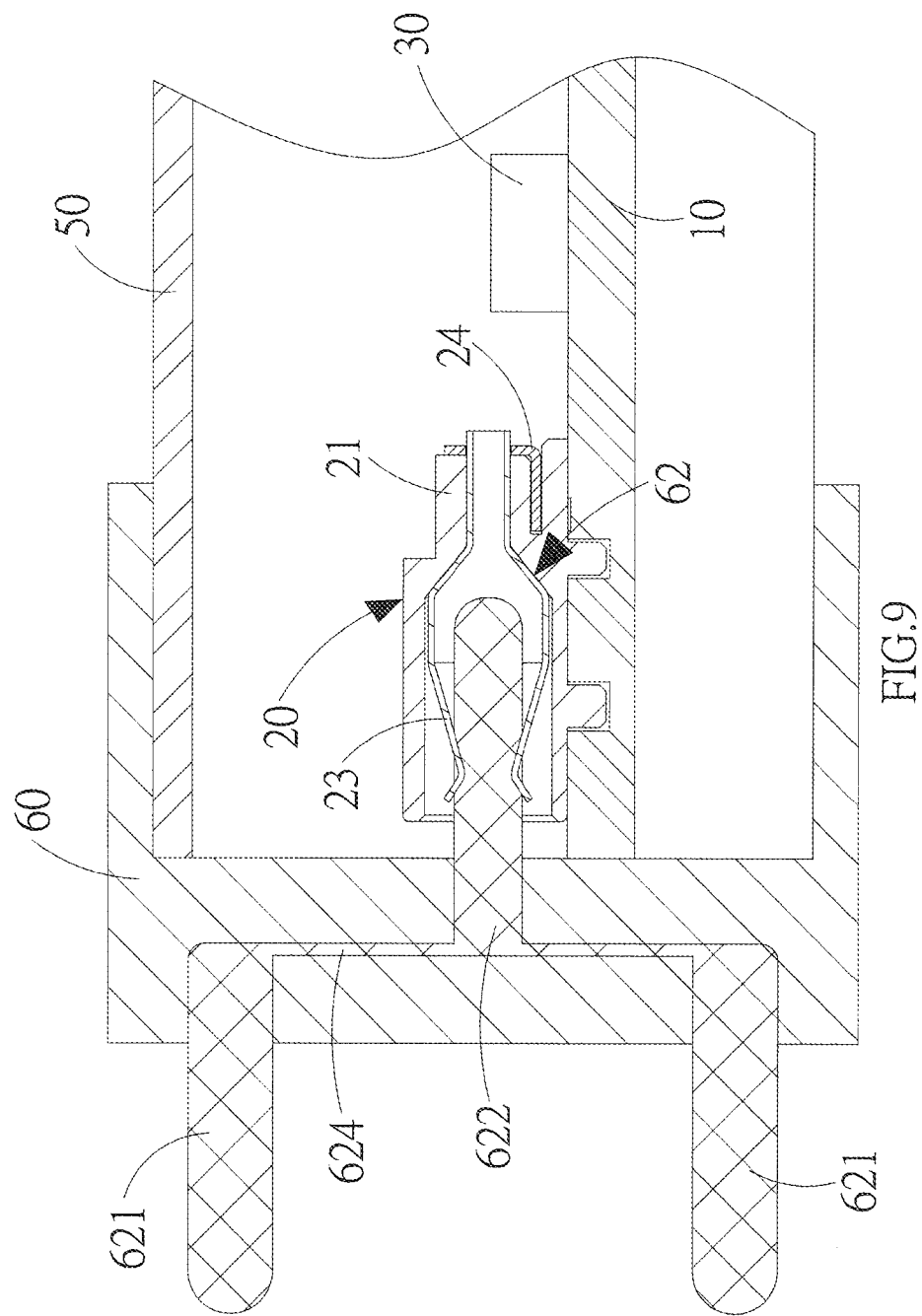

Step (J): conducting a third assembling step. The end caps 60 are assembled and fixed at two end sides of the semi-finished product that has been completed in the previous step (H), as shown in FIG. 9. In addition, the conductive terminal 62 is connected with the connecting seat 20, such that the pole-like conducting unit 622 can be inserted into the terminal 23 of the connecting seat 20 to be energized, thereby accomplishing the light-emitting-diode lamp tube.

Furthermore, a step (K) is further executed between the step (D) and the step (E). The step (K) conducts a detection test by feeding in voltage to separate non-defective products from defective products; subsequent steps are conducted for the non-defective products, whereas an examination and fixing step is carried out for the defective products. In addition, a step (L) is further executed between the step (F) and the step (G). The step (L) conducts an aging test which is performed under a different temperature (such as 25° C., 45° C., 55° C. or 85° C.) and for a long time (about 6000 hours). The aging test is able to separate non-defective products from defective products; subsequent steps are conducted for the non-defective products, whereas an examination and fixing step is carried out for the defective products.

On the other hand, a step (M) is further executed following the step (J). The step (M) conducts a photoelectric test to separate non-defective products from defective products; an examination and fixing step is carried out for the defective products. The step (L) is further executed following the step (M). The step (L) conducts the aging test to separate non-defective products from defective products, and an examination and fixing step is carried out for the defective products.

Figure 10:
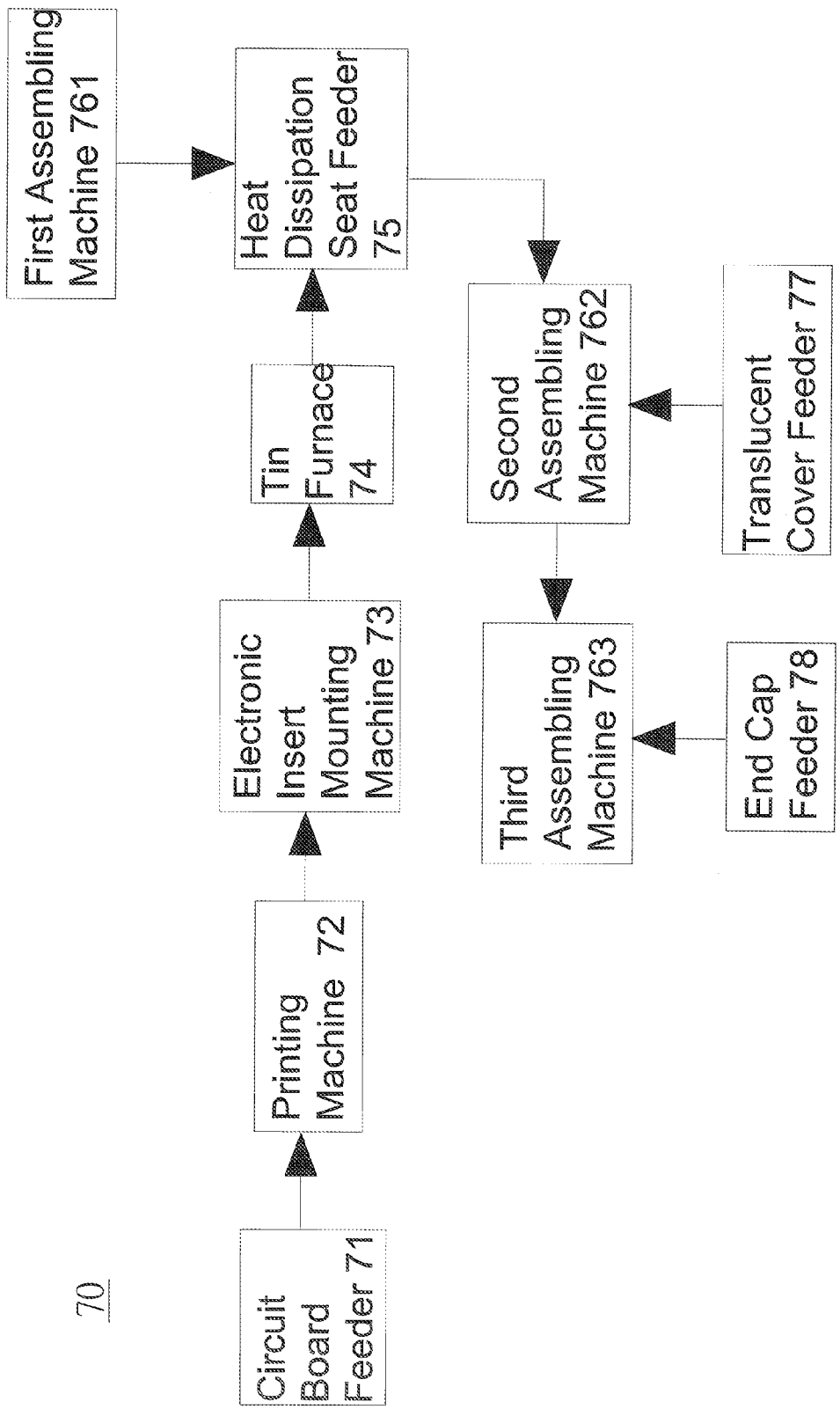
FIG. 10 shows a schematic view of a device for making a light-emitting-diode lamp tube, according to the present invention.

Moreover, the present invention also provides a manufacturing device to accomplish the abovementioned manufacturing process. Referring to FIG. 10, the manufacturing device 70 comprises:

a circuit board feeder 71 which is used to provide the circuit board in a shape of a long strip;

a printing machine 72 which is disposed following the circuit board feeder 71 to receive the circuit board and to print the bonding layer on the surface of the circuit board;

an electronic insert mounting machine 73 which is disposed following the printing machine 72 to receive the abovementioned circuit board and to provide two connecting seats and plural light emitting diodes on the circuit board;

a tin furnace 74 which is disposed following the electronic insert mounting machine 73 to receive the abovementioned circuit board and to heat up the circuit board to melt down the bonding layer, such that the connecting seats and the light emitting diodes can be attached and fixed on the circuit board;

a heat dissipation seat feeder 75 which is used to provide the heat dissipation seat;

a first assembling machine 761 which is disposed following the tin furnace 74 and the heat dissipation seat feeder 75 to receive the circuit board that has been loaded with the connecting seats and the light emitting diodes, as well as the heat dissipation seat, and to assemble the circuit board on the heat dissipation seat;

a translucent cover feeder 77 which is used to provide the translucent cover;

a second assembling machine 762 which is disposed following the first assembling machine 761 and the translucent cover feeder 77 to receive the circuit board, the heat dissipation seat and the translucent cover that can be assembled together, and to assemble the translucent cover on the heat dissipation seat;

an end cap feeder 78 which is used to provide the end caps;

a third assembling machine 763 which is disposed following the second assembling machine 762 and the end cap feeder 78 to receive the circuit board, the heat dissipation seat, the translucent cover and the end caps that can be assembled together, and to assemble the end caps at two end sides of the circuit board and the translucent cover, thereby accomplishing the light-emitting-diode lamp tube.

By the abovementioned steps, the light-emitting-diode lamp tube can be produced automatically, the manufacturing process can be simplified to reduce the labor cost, and the yield factor can be improved considerably.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A method of making a light-emitting-diode lamp tube, comprising following sequential steps orderly:

a step (A) for providing a circuit board in a shape of a long strip, wherein the circuit board is provided with an outbound circuit and an inbound circuit;

a step (B) for printing a bonding layer on a surface of the outbound circuit and the inbound circuit of the circuit board;

a step (C) for mounting electronic inserts, with that a connecting seat is disposed on the outbound circuit of the circuit board where the bonding layer is provided, and light emitting diodes are disposed on the inbound circuit of the circuit board where the bonding layer is provided, wherein the connecting seat is disposed at an end side of the circuit board;

a step (D) for heating up the circuit board to melt down the bonding layer, enabling the connecting seat and the light emitting diodes to be fixed on the circuit board;

a step (E) for providing a heat dissipation seat which is in a shape of a long strip and is provided with a straight fixing surface;

a step (F) for conducting a first assembling step to assemble and fix the circuit board that has been loaded with the light emitting diodes in the step (D) on the straight fixing surface of the heat dissipation seat;

after the step (F), a step (G) for providing a translucent cover which is a long strip of an arc-shaped unit;

a step (H) for conducting a second assembling step to assemble and fix the translucent cover on the heat dissipation seat that has been completed in the step (F), and to shield the circuit board;

after the step (H), a step (I) for providing an end cap which is a round body and is provided with a conductive terminal; and a step (J) for conducting a third assembling step to assemble and fix the end caps on two end sides of the semi-finished product that has been completed in the step (H), and to connect the conductive terminal with the connecting seat, thereby accomplishing the lamp tube.

2. The method of making a light-emitting-diode lamp tube, according to claim 1, wherein a step (K) is further executed between the step (D) and the step (E) to conduct a detection test by feeding in voltage to separate non-defective products from defective products; subsequent steps being conducted for the non-defective products, whereas an examination and fixing step being carried out for the defective products.

3. The method of making a light-emitting-diode lamp tube, according to claim 1, wherein in the step (E) of providing the heat dissipation seat, the straight fixing surface of the heat dissipation seat is provided with heat conductive grease.

4. The method of making a light-emitting-diode lamp tube, according to claim 1, wherein a step (L) is further executed between the step (F) and the step (G) to conduct an aging test to separate non-defective products from defective products; subsequent steps being conducted for the non-defective products, whereas an examination and fixing steps being carried out for the defective products.

5. The method of making a light-emitting-diode lamp tube, according to claim 1, wherein a step (M) is further executed following the step (J) to conduct a photoelectric test to separate non-defective products from defective products; an examination and fixing step being carried out for the defective products.

6. The method of making a light-emitting-diode lamp tube, according to claim 5, wherein the step (L) is further executed following the step (M) to conduct the aging test to separate non-defective products from defective products; an examination and fixing step being carried out for the defective products.

7. The method of making a light-emitting-diode lamp tube, according to claim 5, wherein the bonding layer is a tin paste.

8. The method of making a light-emitting-diode lamp tube, according to claim 7, wherein in the step (D) of heating up the circuit board, the circuit board is heated up with a tin furnace.

9. The method of making a light-emitting-diode lamp tube, according to claim 5, wherein the round body of the end cap is provided with an inner annular wall, the conductive terminal is formed integrally with the round body by injection molding, the conductive terminal is formed with two electric connecting units and a pole-like conducting unit, the pole-like conducting unit is disposed in the inner annular wall, each electric connecting unit and the pole-like conducting unit are connected together by a joining unit, and each electric connecting unit is extended out of the round body from the joining unit.

10. The method of making a light-emitting-diode lamp tube, according to claim 9, wherein the connecting seat is provided with a housing, the housing is provided with an insertion slot, an interior of the insertion slot is provided with a terminal and a conductive plate which is connected with the terminal, the conductive plate is extended to a side of the housing to connect electrically with the outbound circuit of the circuit board, and the insertion slot provides for insertion with the pole-like conducting unit of the end cap, enabling the pole-like conducting unit to be inserted into the terminal to be energized.

* * * * *